(12) United States Patent
Margalit (10) Patent No.: US 8,834,988 B2
(45) Date of Patent: Sep. 16, 2014

(54) PRECISION SPACING FOR STACKED WAFER ASSEMBLIES

(75) Inventor: Mordehai Margalit, Zichron Yaaqov (IL)

(73) Assignee: Empire Technology Development LLC, Wilmington, DE (US)

( * ) Notice: Subject to any disclaimer, the term of this patent is extended or adjusted under 35 U.S.C. 154(b) by 399 days.

(21) Appl. No.: 13/262,089

(22) PCT Filed: Apr. 21, 2011

(86) PCT No.: PCT/US2011/033382
§ 371 (c)(1),
(2), (4) Date: Sep. 29, 2011

(87) PCT Pub. No.: WO2011/133746
PCT Pub. Date: Oct. 27, 2011

(65) Prior Publication Data
US 2012/0034421 A1 Feb. 9, 2012

Related U.S. Application Data
(60) Provisional application No. 61/326,372, filed on Apr. 21, 2010.

(51) Int. Cl.
| | | |
|---|---|---|
| *B32B 3/22* | (2006.01) | |
| *B32B 38/10* | (2006.01) | |
| *H01L 27/146* | (2006.01) | |
| *G02B 3/00* | (2006.01) | |
| *G02B 13/00* | (2006.01) | |
| *H01L 31/0232* | (2014.01) | |

(52) U.S. Cl.
CPC .... *H01L 31/02325* (2013.01); *H01L 27/14685* (2013.01); *H01L 27/14625* (2013.01); *G02B 3/0056* (2013.01); *G02B 13/0085* (2013.01); *G02B 3/0068* (2013.01)
USPC ........................... 428/138; 428/137; 428/131

(58) Field of Classification Search
USPC .......................................... 428/138, 137, 131
See application file for complete search history.

(56) References Cited

U.S. PATENT DOCUMENTS

| | | |
|---|---|---|
| 4,561,015 A | 12/1985 | Korch |
| 7,692,256 B2 | 4/2010 | Rudmann et al. |

(Continued)

FOREIGN PATENT DOCUMENTS

| | | |
|---|---|---|
| EP | 1811772 A2 | 7/2007 |
| JP | 06-034966 | 2/1994 |

(Continued)

OTHER PUBLICATIONS

International Search Report and Written Opinion, PCT/US2011/033382, dated Jul. 8, 2011.

(Continued)

*Primary Examiner* — Brent O'Hern
(74) *Attorney, Agent, or Firm* — Pepper Hamilton LLP (57) ABSTRACT

An assembly including a first wafer, a second wafer, a spacing wafer configured to be positioned between the first wafer and the second wafer, and a plurality of spacing elements configured to be positioned within the spacing wafer and to contact the first wafer and the second wafer, the spacing elements sized to define a first spacing distance between the first wafer and the second wafer.

19 Claims, 9 Drawing Sheets

(56) References Cited

U.S. PATENT DOCUMENTS

| | | | |
|---|---|---|---|
| 2004/0067015 A1 | 4/2004 | Nakajima | |
| 2005/0067681 A1 | 3/2005 | De Villeneuve et al. | |
| 2006/0035408 A1 | 2/2006 | Derderian | |
| 2007/0070511 A1 | 3/2007 | Lee et al. | |
| 2007/0216046 A1 | 9/2007 | Rudmann et al. | |
| 2009/0159200 A1 | 6/2009 | Rossi et al. | |
| 2010/0253832 A1* | 10/2010 | Duparre | 348/360 |

FOREIGN PATENT DOCUMENTS

| | | |
|---|---|---|
| JP | 2004-146946 | 5/2004 |
| JP | 2007-195167 | 8/2007 |
| JP | 3157641 U | 2/2010 |
| KR | 20090070120 A | 7/2009 |
| WO | WO2005/071445 A1 | 8/2005 |
| WO | WO2010/074743 A1 | 7/2010 |

OTHER PUBLICATIONS

Han et al., Low Cost Camera Modules Using Integration of Wafer-Scale Optics and Wafer-Level Packaging of Image Sensors, Tessera Inc., Charlotte, NC 28262, *Communications and Photonics Conference and Exhibition (ACP)*, 2009 Asia; Nov. 2-6, 2009.

Koifman, EVG Improves Wafer Level Lens Molding Process, *Image Sensors World Blog* (Dec. 1, 2010), p. 1-6; printed from internet Mar. 1, 2011, www.image-sensors-world.blogspot.com/2010/12/evg-announces-wafer-level-lens-molding.html.

Lapedus, Will Tessera's 'Smart Module' Gamble Pay Off??, EE|Times News and Analysis, printed from the internet Mar. 1, 2011, www.eetimes.com/electronics-news/4085045/Will-Tessera-s-smart-module-gamble-pay-off-?pagenumber=3.

Zoberbier, et al., Wafer-Level Cameras: Update on Fabrication and Packaging Technologies, *Suss MicroTec* (Dec. 2009), Issue No. 13, p. 7-8.

Heptagon Advanced Micro-Optics Ptd Ltd., www.heptagon.fi [Printed from Internet Sep. 13, 2011].

I-Micrownews, 3D Silicon and Glass Interposers: Technologies, Applications and Markets, www.i-micronews.com/reports/3D-Silicon-Glass-Interposers/156/, [Printed from Internet Sep. 14, 2011].

* cited by examiner

Figure 6

PRECISION SPACING FOR STACKED WAFER ASSEMBLIES

CROSS-REFERENCE TO RELATED APPLICATIONS

This application is a U.S. national stage filing under 35 U.S.C. §371 of International Application No. PCT/US2011/033382 filed Apr. 21, 2011 entitled "Precision Spacing for Stacked Wafer Assemblies," the disclosure of which is incorporated by reference in its entirety. International Application No. PCT/US2011/033382 claims benefit of priority of U.S. Provisional Patent Application No. 61/326,372, entitled "Manufacture of Optical Components," naming Mordehai Margalit as inventor, filed Apr. 21, 2010, which was filed within the twelve months preceding the filing date of the international application, or is an application of which a currently co-pending application is entitled to the benefit of the filing date All subject matter of the listed applications and of any and all parent, grandparent, great-grandparent, etc. applications of the Related Applications is incorporated herein by reference to the extent such subject matter is not inconsistent herewith.

BACKGROUND

Optical elements such as lenses are typically manufactured using either glass or injection molded plastic. Complex optical components manufactured from several lenses are used in numerous consumer devices such as cameras and cellular telephones. To create such complex optical components, manufactured lenses are assembled using various techniques. One such technique is to manufacture a wafer assembly. A wafer assembly typically includes two or more wafers having at least one spacing wafer positioned and bonded in between the two wafers. For example, a simple lens assembly includes two lens wafers. A spacing wafer is positioned and bonded between the two lens wafers, thereby spacing the lens wafers a preferred distance apart.

FIGS. 1A-1D illustrate an exemplary lens assembly 100. Two lens wafers 102 are positioned about a spacing wafer 104. The lens wafers 102 include a plurality of lenses 106. The spacing wafer 104 includes a plurality of holes 108 positioned such that each lens 106 on the lens wafers 102 is positioned within a hole and light transferred by each lens is not interrupted or otherwise disturbed. The spacing wafer may be manufactured from an injection molded polymer such as thermoplastic or thermo-set, ceramic, glass, epoxy, polycarbonate or other similar materials. A layer of bonding material 110 is applied to either an inner face of both the lens wafers 102 or to both faces of the spacing wafer 104. The lens wafers 102 and the spacing wafer 104 are then pressed together, forming the lens assembly 100. Once formed, the lens assembly is cut into individual lenses and scrap material. Due to various informalities in the spacing wafers and the thickness of the bonding material applied, a first lens assembly may be 10 or more microns thicker than a second lens assembly.

SUMMARY

In one general respect, the embodiments disclose an assembly including a first wafer, a second wafer, a spacing wafer configured to be positioned between the first wafer and the second wafer, and a plurality of spacing elements configured to be positioned within the spacing wafer and to contact the first wafer and the second wafer, the spacing elements sized to define a first spacing distance between the first wafer and the second wafer.

In another general respect, the embodiments disclose a method of assembling a wafer assembly including bonding a first wafer to a spacing wafer, inserting a plurality of spacing elements within the spacing wafer, bonding a second wafer to the spacing wafer to form a wafer assembly, and compressing the wafer assembly to form a compressed wafer assembly in which the spacing elements contact both the first wafer and the second wafer thereby resulting in the first wafer and the second wafer being a first spacing distance apart.

In another general respect, the embodiments disclose an assembly including a first wafer including an inner face; a second wafer including an inner face; a spacing wafer including a first face, a second face, and a plurality of holes therethrough, the spacing wafer positioned between the first wafer and the second wafer such that the first face of the spacing wafer is positioned to be bonded to the inner face of the first wafer, and the second face of the spacing wafer is positioned to be bonded to the inner face of the second wafer; and a plurality of spacing elements positioned within at least a portion of the plurality of holes and in contact with both the inner face of the first wafer and the inner face of the second wafer, the spacing elements configured to define a first spacing distance between the first wafer and the second wafer.

In another general respect, the embodiments disclose a method for mounting a lens element at a first focus distance from a base layer including affixing a plurality of spacing elements to the lens element forming a first lens assembly, applying a quantity of deformable material to each of the plurality of spacing elements, applying a first pressing force to the first lens assembly until the deformable material contacts the base layer, applying heat to the deformable material, applying a second pressing force to the first lens assembly thereby deforming the deformable material, and removing the second pressing force when a distance between the lens element and the base layer equals the first focus distance, thereby producing a second lens assembly.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

As used herein, a "lens" refers to one or more optical devices configured to receive, focus, direct and/or transmit light. A lens may be manufactured from glass, polymers, or other light penetrable substances. A "lens wafer" may refer to multiple lenses arranged and mounted on a single wafer layer.

A "bonding material" refers to an adhesive used to affix two or more components together. Exemplary bonding materials may include various adhesives, glues, epoxies and other bonding materials such as two-part epoxies, heat curable adhesives or glues, ultraviolet light curable adhesives of glues, and other similar adhesives.

FIGS. 2A-2D illustrate an exemplary lens assembly 200 including precision spacing elements 216. Two lens wafers 202 may be positioned about a spacing wafer 204. The lens wafers 202 may include a plurality of lenses 206. It should be noted that while the lenses 206 are positioned in four rows and five columns, this is for exemplary purposes only. The number and position of lenses 206 may vary depending on the manufacture and intended use of lens wafers 202.

Figure 1A:
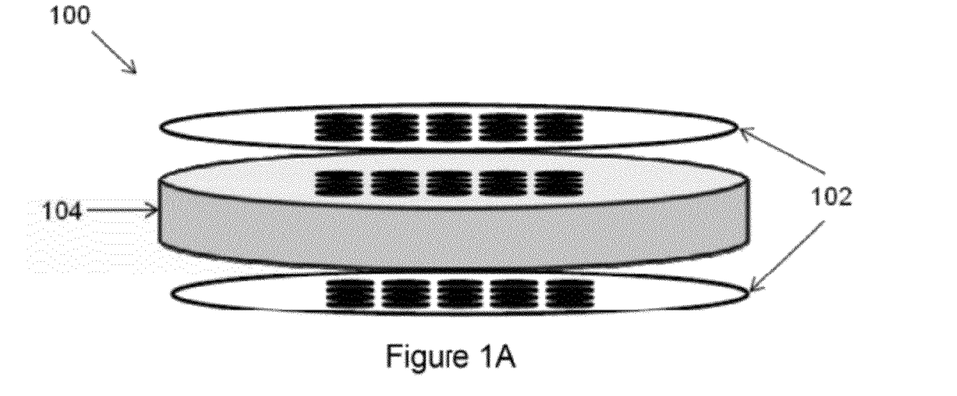
FIGS. 1A-1D illustrate various components of a typical stacked wafer assembly.
Figure 1B:
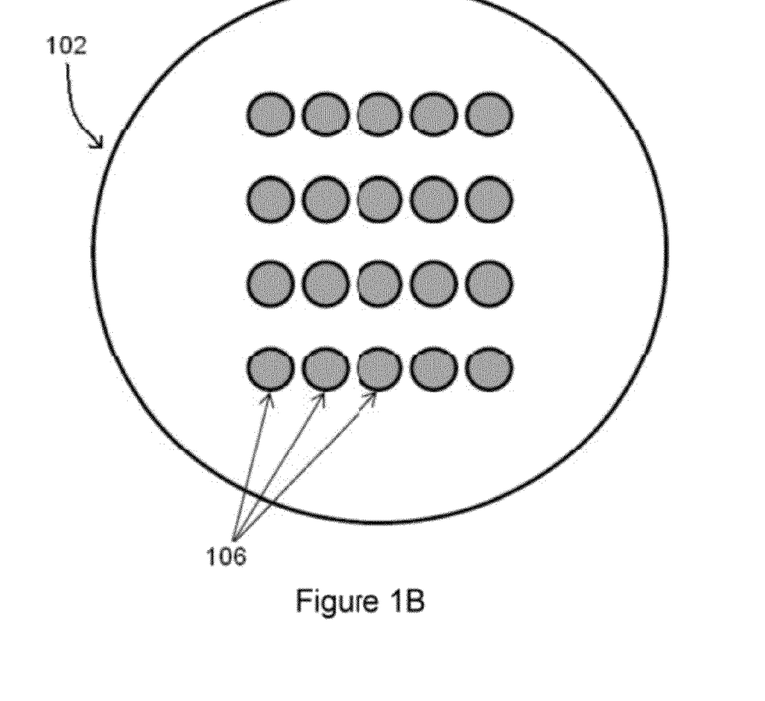
Figure 1C:
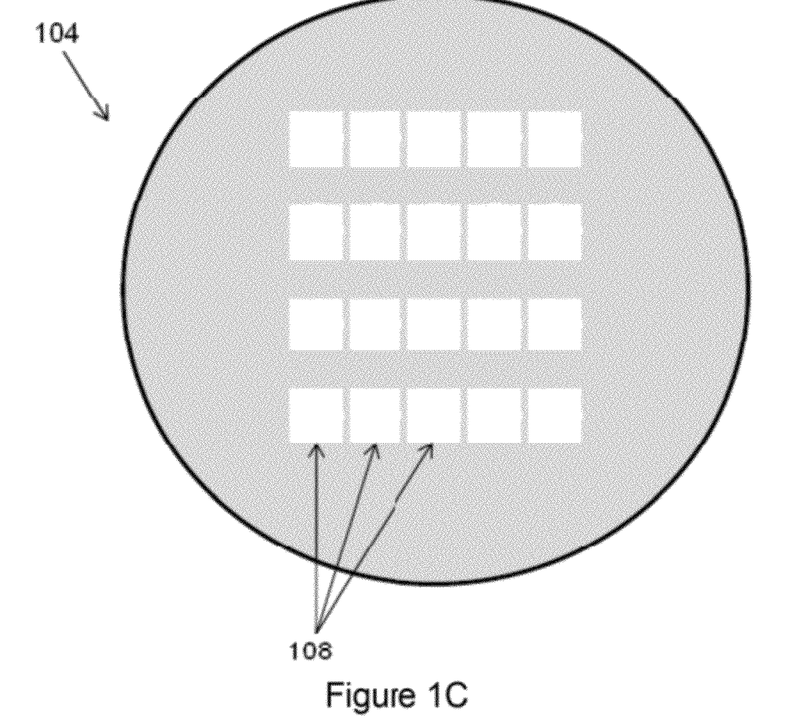
Figure 1D:
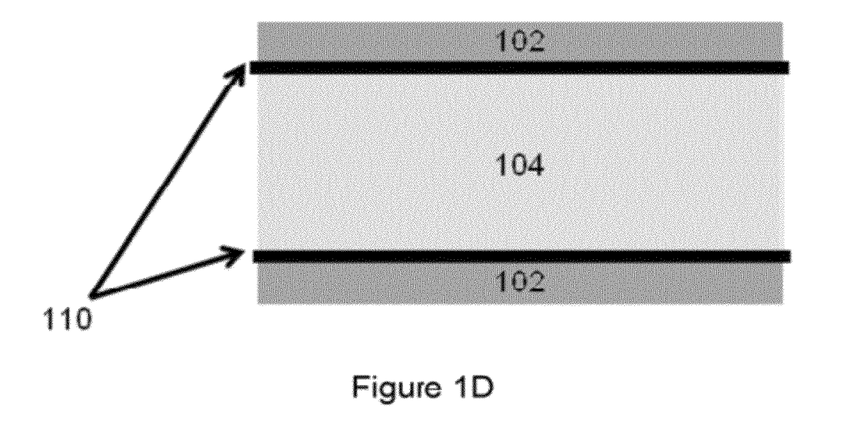
Figure 2A:
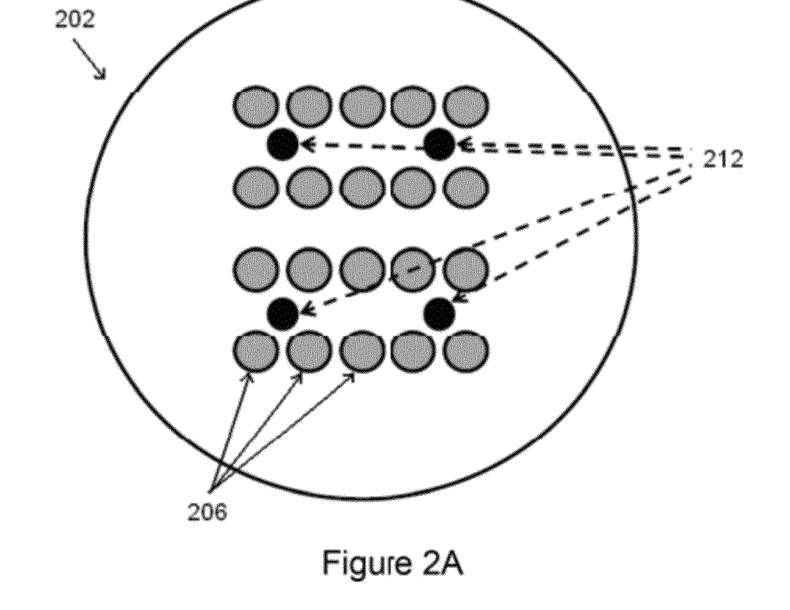
FIGS. 2A-2D illustrate various components of a stacked wafer assembly in accordance with an embodiment described herein.

As shown in FIG. 2A, each lens wafer may include one or more landing pads 212 or smooth areas that are adapted or otherwise configured to receive a precision spacing element 216. The landing pads 212 may be positioned such that any precision spacing element 216 placed in a spacing element hole 214 of the spacing wafer 204 contacts a landing pad 212.

Figure 2B:
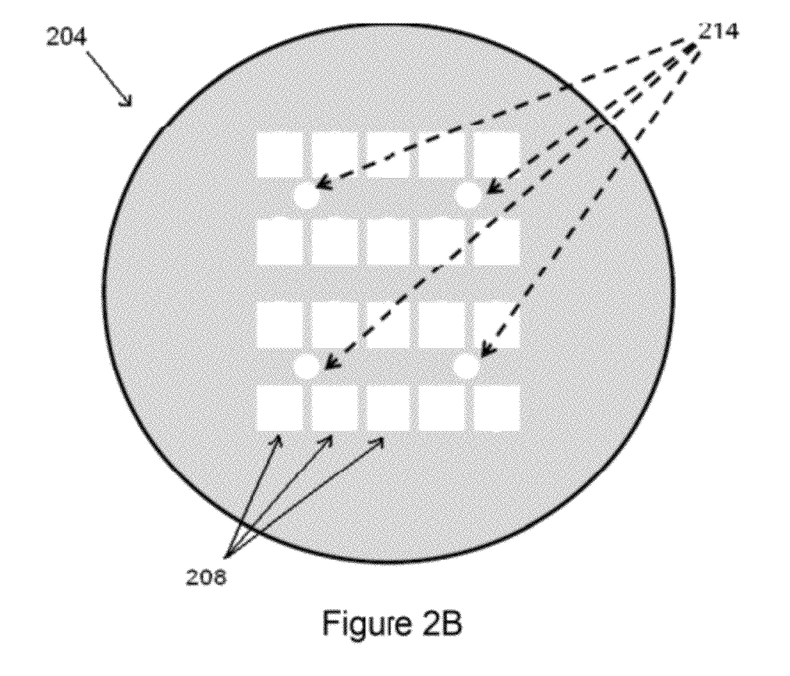

As shown in FIG. 2B, the spacing wafer 204 may include a plurality of holes 208 positioned such that each lens 206 on the lens wafers 202 is positioned within a hole and light transferred by each lens is not interrupted or otherwise disturbed. The spacing wafer 204 may also include one or more spacing element holes 214 configured to receive and position a precision spacing element 216 between the lens wafers 202. The holes 208 and/or 214 can be arranged in a symmetric or asymmetric manner.

Figure 2C:
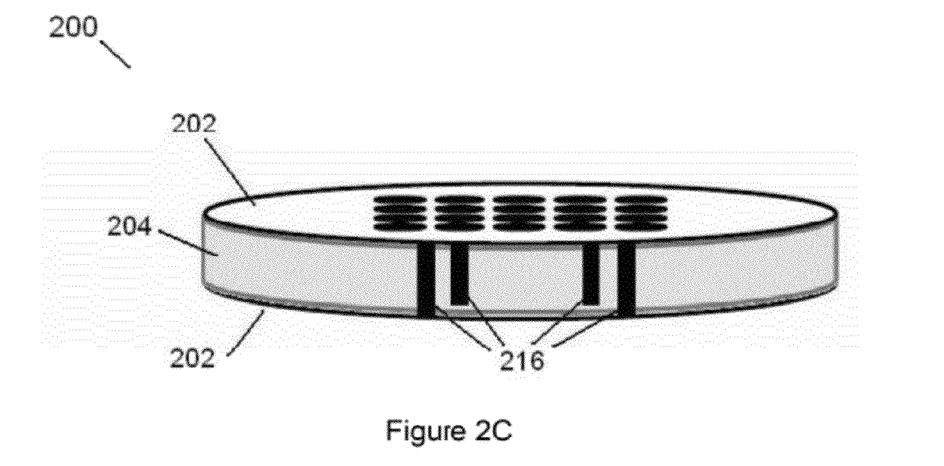

As shown in FIG. 2C, the precision spacing elements 216 are placed through the spacing element holes 214 of the spacing wafer 204 such that the precision spacing wafers contact both inner faces of the lens wafers.

Figure 2D:
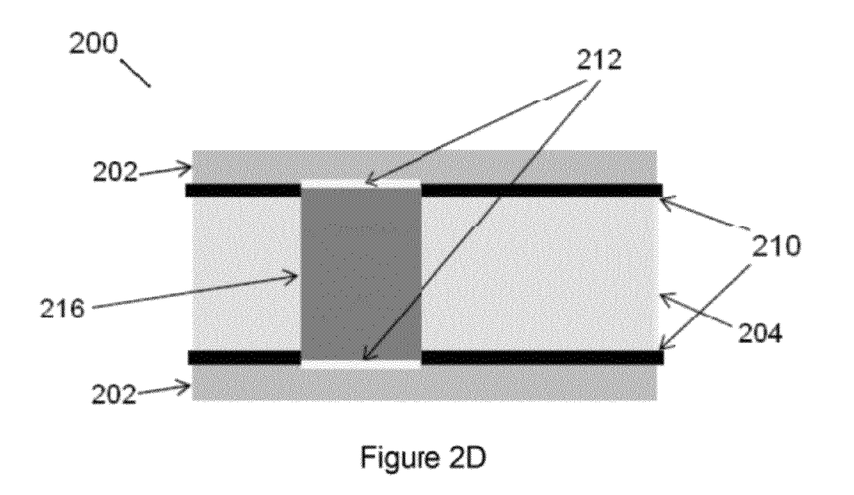

As shown in FIG. 2D, a layer of bonding material 210 may be applied to either an inner face of both lens wafers 202 or to both faces of the spacing wafer 204. Alternatively, the bonding material 210 may be applied to both inner faces of lens wafers 202 as well as both faces of the spacing wafer 204. The lens wafers 202 and the spacing wafer 204 are then pressed together such that the precision spacing elements 216 contact landing pads 212 on each of the lens wafers 202, thereby accurately determining the thickness of the lens assembly 200. Once the bonding material cools or otherwise sets, the lens assembly 200 may be cut or dissected into multiple individual lens assemblies and scrap material. The scrap material includes waste material from the lens wafers 202, waste material from the spacing wafer 204 and the precision spacing elements 216. The waste material may be melted, dissolved in a chemical bath, or similarly removed, thereby separating the waste material and the precision elements 216. The precision elements 216 may then be reused in the manufacture of subsequent lens assemblies.

The precision spacing elements 216 may be manufactured from one or more of glass, metal, ceramic, or another similar material. Examples of such materials include titanium, stainless steel, aluminum, sapphire, zirconia and other gemstones. The precision spacing elements 216 may also be manufactured to a low tolerance level. For example, each spacing element 216 may be manufactured such that at least one dimension of the precision spacing element is within 1 micron of a set spacing distance. Thus, when the precision spacing elements are positioned between the lens wafers 202, the lens wafers are accurately and precisely spaced apart by the set spacing distance.

Additionally, the precision spacing elements may be one of various geometric shapes. For example, the precision spacing elements may be shaped as cylinders having a height equal to the set spacing distance. Similarly, the precision spacing elements may be shaped as spheres having a diameter equal to the set spacing distance. The precision spacing elements may also be shaped as other geometric shapes such as a cube, a pyramid, a block, or other similar geometric shapes.

The height, diameter or other dimension equal to the set spacing distance is typically greater than the thickness of the spacing wafer 204. This provides for a manufacturing process using less precise spacing wafers. For example, the thickness tolerances for the spacing wafers may be increased as the precision spacing elements determining the actual distance between the lens wafers. Thus, the time and expense required to manufacture the spacing wafers may be reduced as compared to the current approach where the spacing wafer must be manufactured to an exact thickness.

It should be noted that various features shown in FIGS. 2A-2D are included for exemplary purposes only and may be omitted depending upon the manufacturing process used and the intended use of the lens assemblies. For example, the landing pads may be removed from the lens wafer. The precision spacing elements may directly abut an unfinished surface of the lens wafer during manufacture. Similarly the precision spacing elements may be placed directly in one of the existing holes in the spacing wafer (e.g., holes 208) without adding any additional spacing element holes.

The manufacture and assembly process of an exemplary lens assembly such as lens assembly 200 is discussed in greater detail with respect to FIGS. 3A-3E and FIG. 4 below.

FIGS. 3A-3E illustrate various stages of manufacture of lens assembly 200. FIG. 4 illustrates an exemplary flow chart illustrating an exemplary manufacturing process for manufacturing lens assembly 200. In the following discussion, each of FIGS. 3A, 3B, 3C, 3D and 3E will be discussed simultaneously with the corresponding process step from FIG. 4.

Figure 3A:
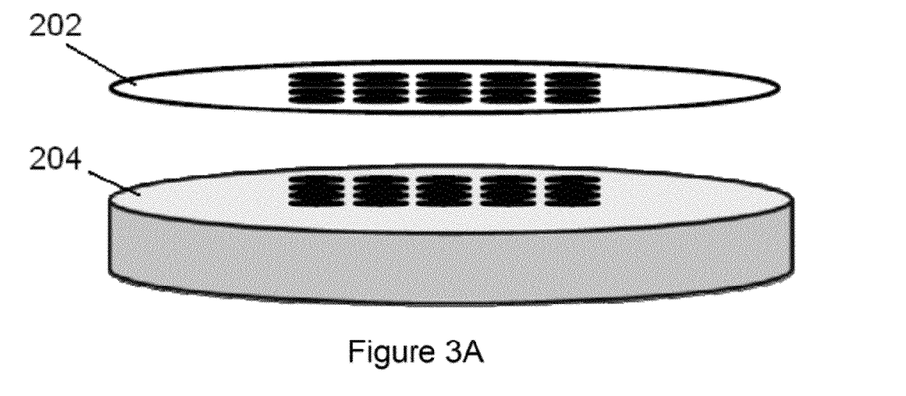
FIGS. 3A-3E illustrate various stages of manufacture for a stacked wafer assembly in accordance with an embodiment described herein.
Figure 3B:
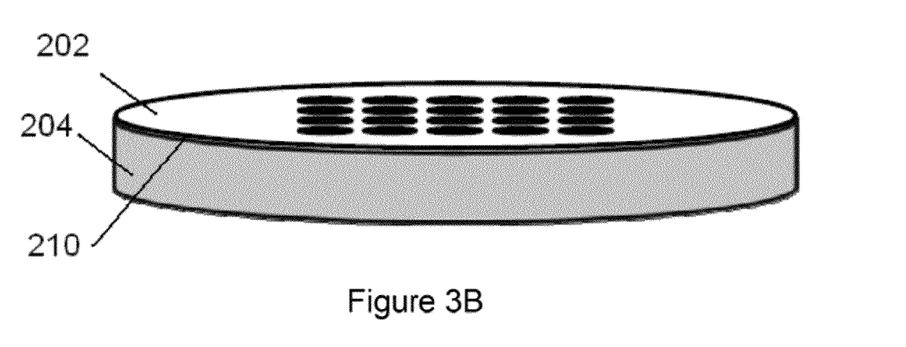
Figure 4:
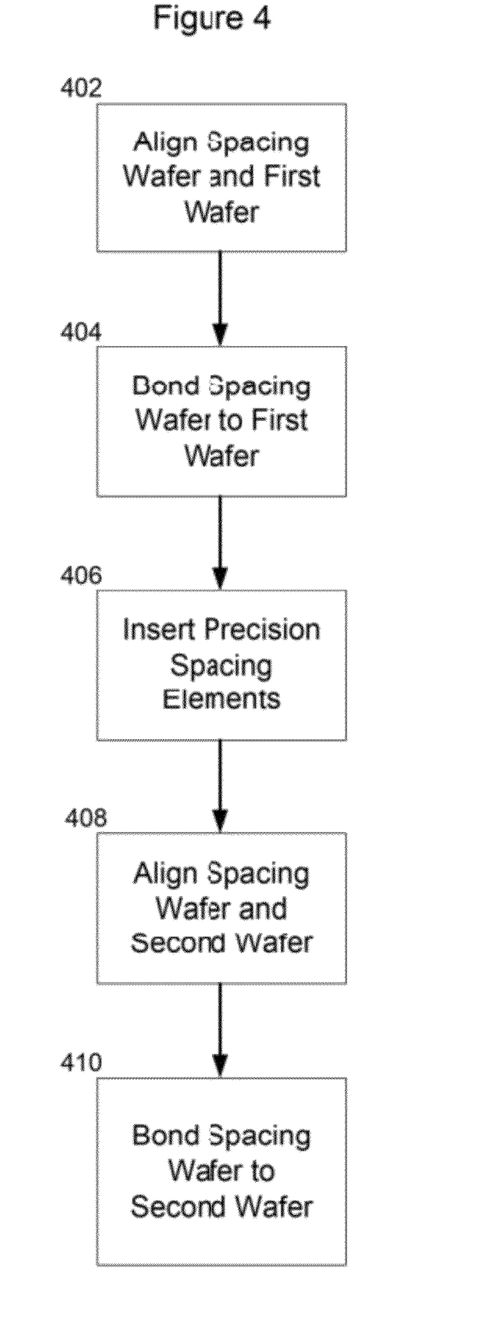
FIG. 4 shows an exemplary flow diagram for manufacture of a stacked wafer assembly in accordance with an embodiment described herein.

Initially, as shown in FIG. 3A, a first lens wafer 202 and a spacing wafer 204 are aligned 402 such that individual lenses of the lens wafer are aligned with the holes of spacing wafer 204. As shown in FIG. 3B, after aligning 402, bonding material 210 may be added to either the inside face of the lens wafer 202 or to the face of the spacing wafer 204 facing the lens wafer, or both, and the two wafers are bonded 404 together. Alternatively, the bonding material 210 may be applied prior to the lens wafer 202 and the spacing wafer 204 being aligned 402.

Figure 3C:
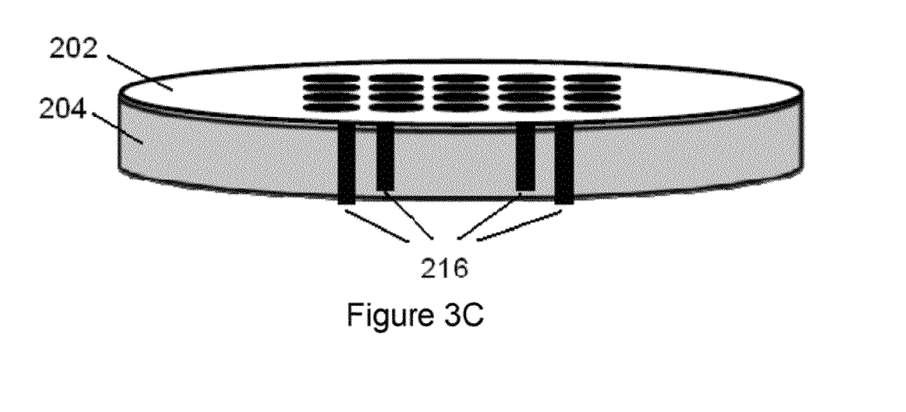

As shown in FIG. 3C, the precision spacing elements 216 may be inserted 406 within the spacing wafer 204. The precision spacing elements 216 may be inserted 406 before the bonding material 210 has cured or otherwise solidified. It should be noted that four precision spacing elements 216 are shown by way of example only. More or fewer precision spacing elements 216 may be used. For example, 1, 2, 3, 4, 5, 6, 7, 8, 9, 10, 11, 12 or more precision spacing elements 216 may be used.

Figure 3D:
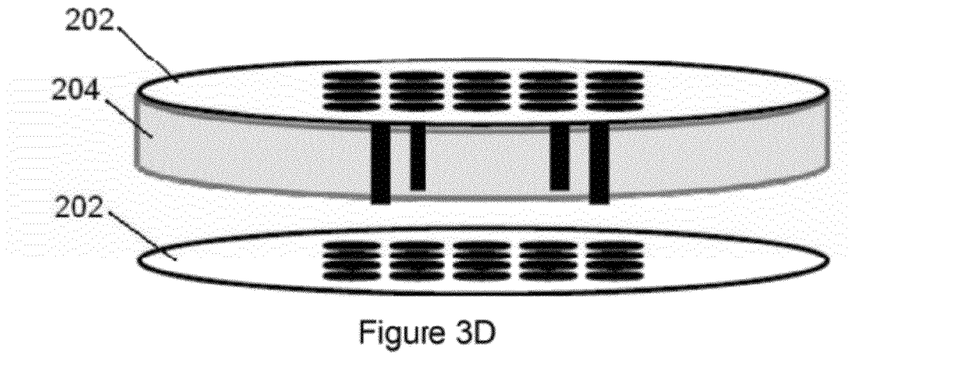
Figure 3E:
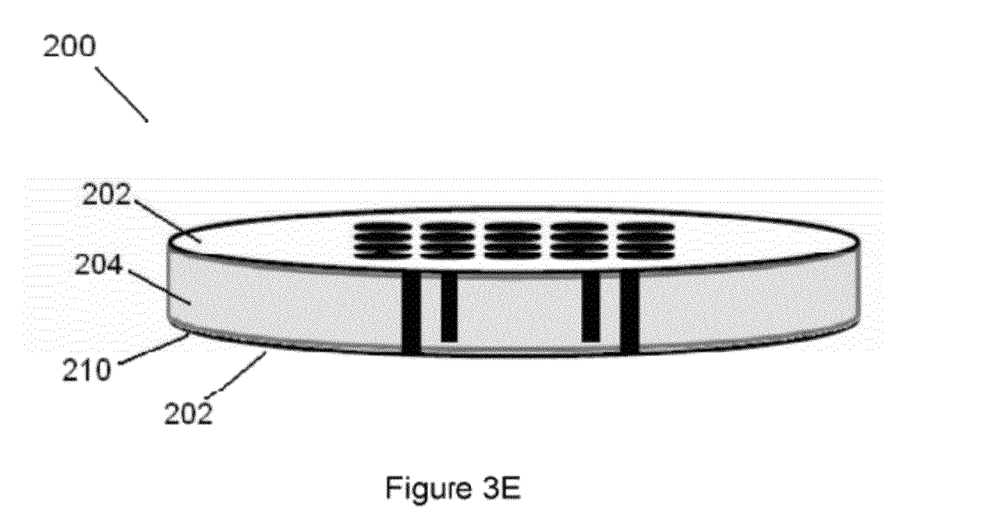

As shown in FIG. 3D, once the precision spacing elements are inserted 406, the second lens wafer 202 may be aligned 408 with the spacing wafer 204. After aligning 408, bonding material 210 may be added to either the inside face of the second lens wafer 202 or to the face of the spacing wafer 204 facing the second lens wafer, or both, and the two wafers are bonded 410 together a compression force is applied, thereby resulting in a compressed wafer assembly such as lens assembly 200 as shown in FIG. 3E. Alternatively, the bonding material 210 may be applied prior to the lens wafer 202 and the spacing wafer 204 being aligned 408 and compressed. The compression force as applied to the wafer assembly may be about 5 kilopascals (kPa) to about 100 kPa. Specific examples of compression force include about 5 kPa, about 10 kPa, about 25 kPa, about 50 kPa, about 100 kPa, and ranges between any two of these values. It should be noted the values for the compression force are shown by way of example only and may vary depending upon the materials and manufacturing techniques used.

After the compressed wafer assembly has completely cured, the assembly may be dissected into multiple individual assemblies and scrap material. The scrap material may include the precision spacing elements along with any waste material from the wafers. The waste material may be melted, dissolved, or otherwise removed and separated from the precision spacing elements, thereby leaving the precision spacing elements free of any waste material or debris and ready to be reused in the manufacture of a subsequent compressed wafer assembly.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

It should be noted that the assemblies and processes listed above may be manufactured and performed using manufacturing equipment and techniques similar to those used in Very Large Scale Integration (VLSI) semiconductor manufacturing. For example, a single manufacturing machine may be configured and programmed to perform the necessary process steps to manufacture a stacked wafer assembly as discussed above. Alternatively, two or more manufacturing machines may be used in concert to perform the necessary process steps to manufacture a stacked wafer assembly. It should also be noted that optical wafer assemblies are discussed herein by way of example only. The above described assemblies and manufacturing processes may be used for any stacked wafer assembly.

Figure 5A:
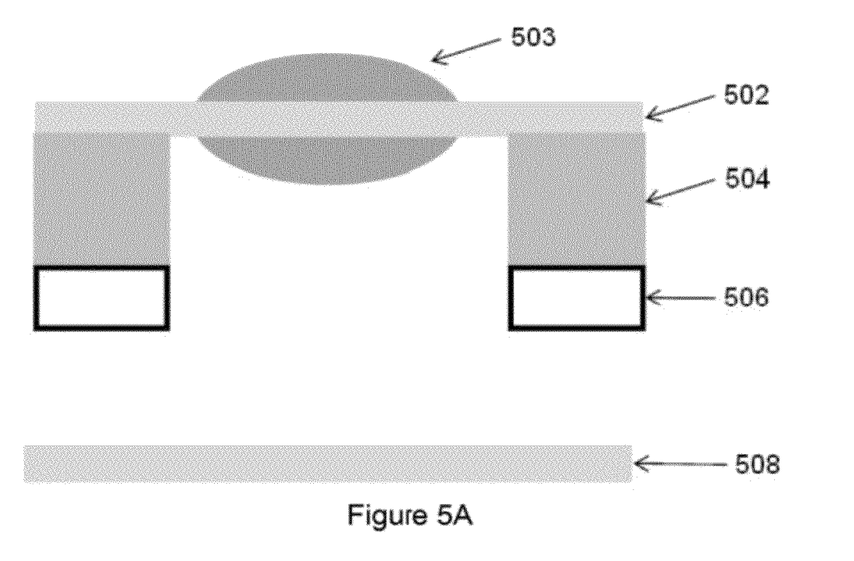
FIGS. 5A and 5B illustrate various stages of manufacture for an alternative assembly in accordance with an embodiment described herein.
Figure 5B:
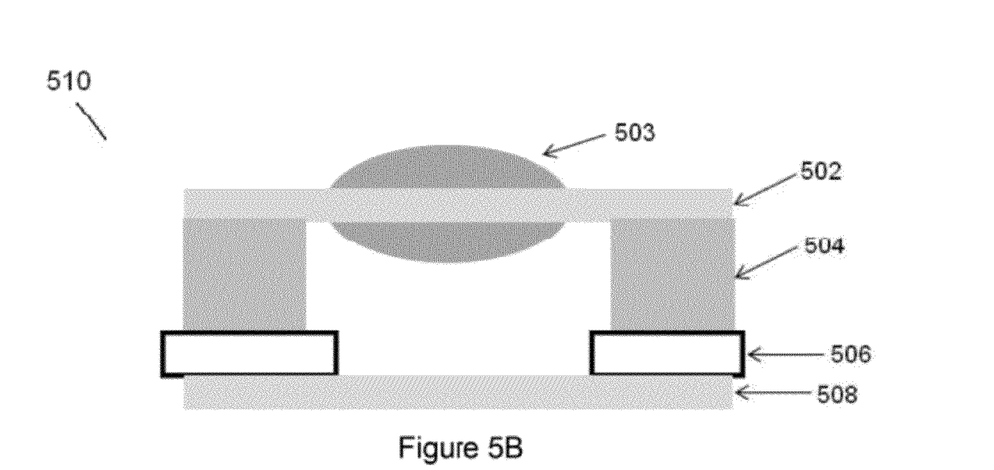
Figure 6:
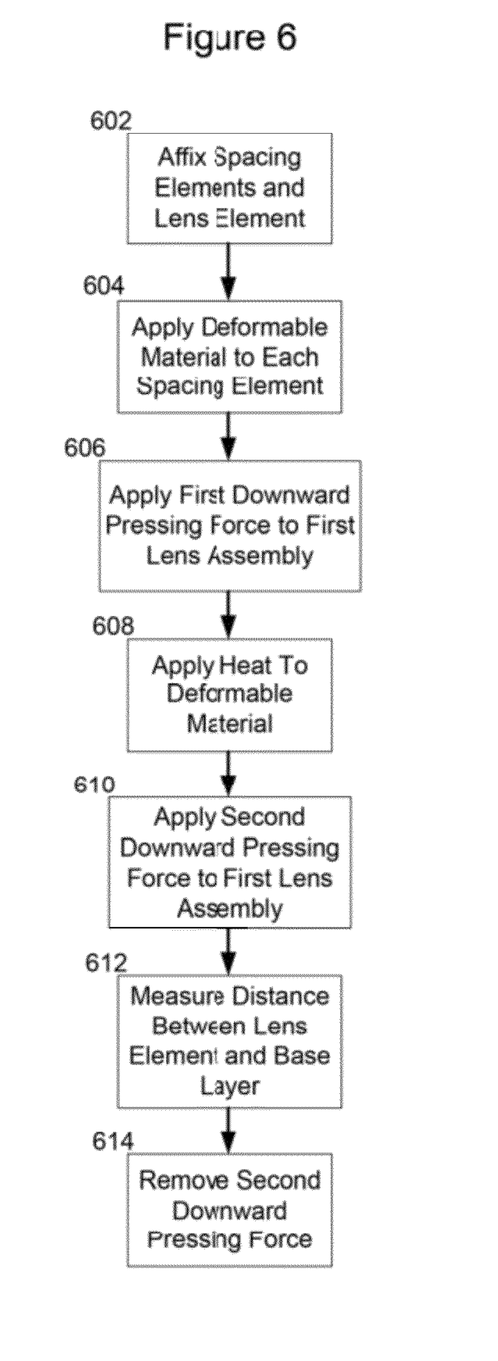
FIG. 6 shows an exemplary flow diagram for manufacture of an alternative assembly in accordance with an embodiment described herein.

FIG. 5A and 5B, along with FIG. 6, illustrate an alternative lens assembly and method of manufacture. In some applications, a stacked wafer assembly does not provide sufficient structure for a lens assembly. For example, a desired focal distance between a lens and a focal point may not be achievable by using a spacing wafer. Rather, a lens element may be mounted to a base layer by a plurality of spacing elements configured and sized to support and position the lens element a desired focal distance from the base layer. In the following discussion, each of FIGS. 5A and 5B will be discussed simultaneously with the corresponding process step from FIG. 6.

As shown in FIG. 5A, a lens element 502, including one or more lenses 503, may have a plurality of spacing elements 504 affixed 602 thereon, forming a first lens assembly. A quantity of deformable material 506 may be applied 604 to each of the spacing elements 504. A first downward pressing force may be applied 606 to the first lens assembly until the deformable material 506 contacts a base layer 508. The base layer 508 may be a circuit board or other similar structure having one or more additional optical components mounted thereon. For example, the base layer 508 may include an additional lens, one or more image sensors, or other similar optical components.

Once the deformable material 506 contacts the base layer 508, heat may be applied 608 to the deformable material. The applied heat may be about 150° C. to about 200° C. Specific examples of the applied heat include 150° C., 160° C., 175° C., 190° C., 200° C., and ranges between any two of these values. It should be noted the values for the applied heat are shown by way of example only and may vary depending upon the materials used.

A second downward pressing force may be applied 610 to the first lens assembly, thereby deforming the deformable material 506 against the base layer 508. A lens measuring tool may be used to measure 612 the distance between the one or more lenses 503 and the base layer 508. When the distance between the one or more lenses 503 and the base layer 508 equals the desired focus distance, the second pressing force is removed 614. The deformable material may act as a bonding material bonding the first lens assembly to the base layer 508, thereby resulting in a second lens assembly 510 as shown in FIG. 5B.

During manufacture, the first downward force may be less than the second downward in order to accurately determine when the deformable material 506 contacts the base layer 508. Similarly, a larger second downward force provides additional pressure for deforming the deformable material 506. The first downward force may be about 10 pascals (Pa) to about 25 Pa. Specific examples of the first downward force include 10 Pa, 15 Pa, 20 Pa, 25 Pa, and ranges between any two of these values. The second downward force may be about 50 Pa to about 100 Pa. Specific examples of the first downward force include 50 Pa, 60 Pa, 75 Pa, 90 Pa, 100 Pa, and ranges between any two of these values. It should be noted the values for first downward force and second downward force are shown by way of example only and may vary depending upon the materials and manufacturing techniques used.

The above discussed assemblies and processes related to FIGS. 5A, 5B and 6 result in a manufacturing technique where individual components can be manufactured quickly and cheaply without concern for accurate dimensions. For example, the importance of the exact length of spacing elements 504 is reduced as the manufacturing device can adjust the overall focus distance based upon the amount of second downward pressing force applied to the first lens assembly, thereby increasing or decreasing the amount of deformation of the deformable material 506. This reduces the overall cost of the lens assembly as it is less likely that individual components will be discarded due to manufacturing defects.

It should be noted that the deformable material 506 is used as a bonding material by way of example only. An additional bonding material may be applied between the deformable material 506 and the base layer 508.

It should also be noted that the assemblies and processes described above with respect to FIGS. 5A, 5B and 6 may be manufactured and performed using manufacturing equipment and techniques similar to integrated circuit board manufacturing. For example, a "pick and place" machine may be configured to align each first lens assembly with a base layer and apply any necessary downward pressing forces to manufacture a second lens assembly as discussed above. Alternatively, multiple manufacturing machines may be used such as those described above in regard to the VLSI semiconductor manufacturing.

In the above detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be used, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds, compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

EXAMPLE 1

Precisely-Spaced Lens Assembly Manufacturing Using Titanium Spacing Elements

Lens assemblies are typically manufactured in a batch process where a stacked wafer assembly is constructed and dissected into numerous individual lens assemblies. For example, a stacked wafer assembly includes two lens wafers having individual lenses arranged in a 25×25 grid, resulting in 625 individual lenses. Once the stacked wafer assembly is constructed, it is dissected into 625 individual lens assemblies.

The first lens wafer is manufactured from a glass wafer and a polymer layer adhered thereon, the polymer layer including the grid of lenses manufactured by hot embossing the polymer layer against a master wafer, thereby defining the shape, size and position of the individual lenses. The lenses may be arranged about the glass wafer in a specific pattern depending upon the number, size and shape of the one or more lenses. In this example, the lenses are arranged in the 25×25 grid. The glass wafer thickness is about 400 microns. The one or more lenses each have a curvature depth or sag of about 200 microns. The second lens wafer is identical in dimension to the first lens. However, the individual lens may differ in size depending upon the optical characteristics of the lens assemblies. In this example, each lens wafer is identical.

A spacing wafer is manufactured from an injection molded polymer having a thickness of about 500 microns. The spacing wafer includes holes equal in number to the lenses of the glass wafers and positioned such that any light transmitted by the one or more lenses passes through the spacing wafer. In this example, the spacing wafer includes a grid of 25×25 holes positioned such that each lens of the lens wafers is positioned within a hole. The stacking wafer also includes a set of spacing element holes about the periphery of the spacing wafer for the insertion of precision spacing elements.

In the completed lens assemblies, the first lens wafer and the second lens wafer are to be 550 microns apart. As such, a number of spherical titanium precision spacing elements are manufactured to be 550 microns in diameter. As the titanium precision spacing elements ultimately define the spacing distance between the first lens wafer and the second lens wafer, the spacing elements are manufactured to a low tolerance of about plus or minus 1 micron.

During manufacture of the stacked wafer assembly, a two part "AB" epoxy (e.g., an epoxy including an "A" or resin component and a "B" or hardener component) is used to adhere the various wafers. The "A" or resin epoxy component is applied to an inner face of both the lens wafers, and the "B" or hardener epoxy component is applied to both faces of the spacing wafer. The first lens wafer is aligned and pressed against the spacing wafer. Multiple titanium precision spacing elements are then placed within the spacing wafer about its periphery in the spacing element holes such that, when the stacked wafer assembly is compressed, the first lens wafer and the second lens wafer contact the titanium precision spacing elements, thereby resulting in a wafer assembly where the first lens wafer and the second lens wafer are exactly 550 microns apart. The second lens wafer is aligned with the spacing wafer and pressed against the spacing wafer. The stacked wafer assembly is compressed such that the two lens wafers contact the titanium spacing elements. Approximately 150° C. heat is applied to the stacked wafer assembly to cure the epoxy.

After curing, the wafer assembly is dissected into 625 individual lens assemblies and an amount of scrap material. The scrap material includes waste from both lens wafers as well as waste from the spacing wafer. The waste from the spacing wafer includes the titanium precision spacing elements. The scrap material is heated to approximately 300° C. where the waste material melts and the titanium precision elements are retrieved from the waste material, cleaned, inspected for any defects, and returned to a supply of the spacing elements for use in manufacturing another batch of lens assemblies.

This exemplary manufacturing process results in 625 precisely-spaced lens assemblies while using non-precise spacing wafers. Spacing wafers manufactured to an exact thickness such as 550 microns is an expensive and time consuming task. Once bonded and dissected, the monetary and time investment spent on the spacing wafer is only distributed among the individual lens assemblies made from that single spacing wafer. This example shows that a set of precision spacing elements can be used for multiple stacked wafer assemblies, thereby distributing the cost of the precision spacing elements over many stacked wafer assemblies, thereby lowering the cost of each assembly.

EXAMPLE 2

Semiconductor Packaging

Packaging for various semiconductor components is trending toward air-cavity packaging. The height of the package lid influences the microwave and radio-frequency operation of the semiconductor and is closely controlled. During manufacture of the package, a ceramic or similar material lid and various spacers are used to hold the lid a certain distance from the semiconductor. Precision spacing elements such as those taught herein will be used during the manufacture of the semiconductor packaging to produce a highly accurate, and reproducible, semiconductor package. Stacked wafer assembly manufacturing techniques similar to those discussed in Example 1 will be used to manufacture a batch of semiconductor packages. After manufacture, the stacked wafer assemblies will be dissected into the semiconductor packages and waste material. The precision spacing elements will be recovered from the waste material for use in manufacturing another batch of semiconductor packages.

EXAMPLE 3

Customer Available Lens Assembly And Precision Spacing Element Kits

Lens assembly kits will be sold such that electronic manufacturers can construct lens assemblies as needed as opposed to purchasing individual lens assemblies from a separate manufacturer. The kit will include two or more lens wafers and one or more spacing wafers. An additional kit will be sold that includes one or more sets of the precision spacing elements. Various quality levels of precision spacing elements will be offered. As the quality level increases, the durability, precision and cost increases as well. For example, the highest quality will be made from a gemstone such as sapphire that has been carefully grinded and shaped to the exact spacing requirements of the customer. Lower quality materials will include single-use precision spacing elements made from an injection molded polymer, ceramic precision spacing elements grinded and shaped, and metal precision spacing elements such as the titanium spacing elements discussed in Example 1.

Based upon the customer's needs, the customer will purchase multiple lens assembly kits along with at least one precision spacing element kit. The customer will reuse the precision spacing elements for the manufacture of multiple stacked lens wafer assemblies, thereby accurately and quickly producing lens assemblies as needed. Thus, the cost of the precision spacing elements will be distributed over a greater number of lens assemblies, thereby reducing the cost of each lens assembly.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An assembly comprising:
a first wafer;
a second wafer;
a spacing wafer configured to be positioned between the first wafer and the second wafer; and
a plurality of removable and reusable spacing elements configured to be positioned within the spacing wafer and to contact the first wafer and the second wafer, the removable and reusable spacing elements sized to define a first spacing distance between the first wafer and the second wafer.

2. The assembly of claim 1, wherein the spacing wafer includes a plurality of holes therethrough, wherein each of the plurality of removable and reusable spacing elements is configured to be positioned within a hole.

3. The assembly of claim 1, wherein the spacing wafer is bonded to both the first wafer and the second wafer forming a bonded wafer assembly configured to be dissected into a plurality of assemblies and scrap material.

4. The assembly of claim 3, wherein the removable and reusable spacing elements are contained within the scrap material.

5. The assembly of claim 1, wherein each of the plurality of removable and reusable spacing elements is manufactured from at least one of a materials group consisting of glass, metal, ceramic, sapphire and zirconia.

6. The assembly of claim 1, wherein each of the plurality of removable and reusable spacing elements is manufactured such that at least one dimension of a removable and reusable spacing element equals the first spacing distance.

7. The assembly of claim 1, wherein each of the plurality of removable and reusable spacing elements is a sphere having a diameter equal to the first spacing distance.

8. The assembly of claim 1, wherein the first wafer and the second wafer are lens wafers.

9. The assembly of claim 1, wherein the plurality of removable and reusable spacing elements are further configured to accurately define a thickness of the assembly.

10. The assembly of claim 1, wherein the plurality of removable and reusable spacing elements are further configured to be usable in a second assembly.

11. An assembly comprising:
a first wafer comprising an inner face;
a second wafer comprising an inner face;
a spacing wafer comprising a first face, a second face, and a plurality of holes therethrough, the spacing wafer positioned between the first wafer and the second wafer such that the first face of the spacing wafer is positioned to be bonded to the inner face of the first wafer, and the second face of the spacing wafer is positioned to be bonded to the inner face of the second wafer; and
a plurality of removable and reusable spacing elements positioned within at least a portion of the plurality of holes and in contact with both the inner face of the first wafer and the inner face of the second wafer, the removable and reusable spacing elements configured to define a first spacing distance between the first wafer and the second wafer.

12. The assembly of claim 11, wherein the spacing wafer is bonded to both the first wafer and the second wafer forming a bonded wafer assembly configured to be dissected into a plurality of assemblies and scrap material.

13. The assembly of claim 12, wherein the removable and reusable spacing elements are contained within the scrap material.

14. The assembly of claim 11, wherein each of the plurality of removable and reusable spacing elements is manufactured from at least one of a materials group consisting of glass, metal, ceramic, sapphire and zirconia.

15. The assembly of claim 11, wherein each of the plurality of removable and reusable spacing elements is manufactured such that at least one dimension of the spacing element equals the first spacing distance.

16. The assembly of claim 11, wherein each of the plurality of removable and reusable spacing elements is a sphere having a diameter equal to the first spacing distance.

17. The assembly of claim 11, wherein the first wafer and the second wafer are lens wafers.

18. The assembly of claim 11, wherein the plurality of removable and reusable spacing elements are further configured to accurately define a thickness of the assembly.

19. The assembly of claim 11, wherein the plurality of removable and reusable spacing elements are further configured to be usable in a second assembly.

* * * * *

UNITED STATES PATENT AND TRADEMARK OFFICE
CERTIFICATE OF CORRECTION

| | | |
|---|---|---|
| PATENT NO. | : 8,834,988 B2 | Page 1 of 1 |
| APPLICATION NO. | : 13/262089 | |
| DATED | : September 16, 2014 | |
| INVENTOR(S) | : Margalit | |

It is certified that error appears in the above-identified patent and that said Letters Patent is hereby corrected as shown below:

Title Page

On Page 2, Item (56), under "OTHER PUBLICATIONS", in Column 2, Line 14, delete "Ptd" and insert -- Pte --, therefor.

On Page 2, Item (56), under "OTHER PUBLICATIONS", in Column 2, Line 16, delete "I-Micrownews," and insert -- I-Micronews, --, therefor.

In the Specification

In Column 1, Line 19, delete "date" and insert -- date. --, therefor.

Signed and Sealed this
Third Day of March, 2015

Michelle K. Lee
*Deputy Director of the United States Patent and Trademark Office*